United States Patent [19]

Manley et al.

[11] Patent Number: 5,084,414
[45] Date of Patent: Jan. 28, 1992

[54] METAL INTERCONNECTION SYSTEM WITH A PLANAR SURFACE

[75] Inventors: Robert B. Manley; Mark D. Crook, both of Ft. Collins, Colo.

[73] Assignee: Hewlett-Packard Company, Palo Alto, Calif.

[21] Appl. No.: 560,476

[22] Filed: Jul. 27, 1990

Related U.S. Application Data

[63] Continuation of Ser. No. 453,068, Dec. 11, 1989, abandoned, which is a continuation of Ser. No. 218,513, Jul. 5, 1988, abandoned, which is a continuation-in-part of Ser. No. 712,580, Mar. 15, 1985, abandoned.

[51] Int. Cl.$^5$ .................. H01L 21/44; H01L 21/443
[52] U.S. Cl. .................. 437/189; 437/192; 437/977
[58] Field of Search ............... 437/189, 192, 977, 195

[56] References Cited

U.S. PATENT DOCUMENTS

| | | | |
|---|---|---|---|
| 3,477,872 | 11/1969 | Amick | 437/187 |
| 3,785,862 | 1/1974 | Grill | 437/238 |
| 3,982,316 | 9/1976 | Calhoun et al. | 29/589 |
| 4,330,931 | 5/1982 | Liu | 29/590 |
| 4,349,609 | 9/1982 | Takeda et al. | 428/429 |
| 4,367,119 | 1/1983 | Logan et al. | 156/643 |
| 4,404,235 | 9/1983 | Tarng et al. | 437/192 |
| 4,424,671 | 1/1984 | Abbas et al. | 29/591 |
| 4,426,765 | 1/1984 | Shahriary et al. | 29/591 |
| 4,532,702 | 8/1985 | Gigante et al. | 29/591 |
| 4,566,940 | 1/1986 | Itsumi et al. | 156/643 |
| 4,582,563 | 4/1986 | Hazuki et al. | 156/643 |
| 4,584,207 | 4/1986 | Wilson | 427/124 |

FOREIGN PATENT DOCUMENTS

| | | |
|---|---|---|
| 0046525 | 3/1982 | European Pat. Off. |
| 0156999 | 9/1985 | European Pat. Off. |
| 2032320 | 1/1971 | Fed. Rep. of Germany |
| 1330720 | 11/1971 | United Kingdom |
| 1286737 | 8/1972 | United Kingdom |

OTHER PUBLICATIONS

Fathimulla, "Single-Step Lift-Off Process Using Chlorobenzene Soak on AZ4000 Resists", J. Vac. Sci. Technol. B, vol. 3, No. 1, Jan./Feb. 1985, pp. 25–27.

Homma et al., "Feature Size Limit of Liftoff Metallization Technology", IEEE Trans. on Electron Devices, vol. ED-29, No. 4, Apr. 1982, pp. 512–517.

Serikawa et al., "The Size Effect of Liftoff Metallization of Sputtered Aluminum Films", IEEE Trans. on Electron Devices, vol. ED-29, No. 5, May 1982, pp. 834–837.

International Electron Devices Meeting, 1983, Washington, 5th–7th Dec. 1983, pp. 550–553, IEEE, New York, U.S.; T. Moriya et al.: "A Planar Metallization Process-Its Application to Tri-Level Aluminum Interconnection".

Extended Abstracts, vol. 84, No. 1, 6th–11th May 1984, pp. 114–115, Pennington, New York, U.S.; K. C. Saraswat et al.: "Selective CVD of Tungsten for VLSI Technology".

Woodruff et al., *Tungsten and Other Refractory Metals for VLSI Applications*, Mat. Res. Soc. (1986), pp. 173–183.

Edel et al., IBM Tech. Dis. Bull., vol. 14, (May 1972), pp. 3837–3838.

(List continued on next page.)

*Primary Examiner*—Olik Chaudhuri
*Assistant Examiner*—M. Wilczewski
*Attorney, Agent, or Firm*—William W. Cochran; Bloor Redding

[57] ABSTRACT

A process is described for electrically interconnecting electronic devices located on a surface through one or more planar linking layers consisting of conductors and dielectrics. A three-step additive process is disclosed for forming each planar linking layer. The process may be repeated in order to form the multiple linking layers required for complex VLSI circuits. Each layer is formed by a three step process of applying a uniform dielectric, removing the dielectric where the interconnections, including vias and lines, are to be made and then selectively depositing a conductor to form the interconnections.

3 Claims, 10 Drawing Sheets

OTHER PUBLICATIONS

Chen et al., "Photo-CVD for VLSI Isolation", J. Electrochem. Soc., vol. 131, Sep. 1984, pp. 2146-2151.

Rothman, "Process for Forming Passivated Metal Interconnection System with a Planar Surface", J. Electrochem. Soc., vol. 130, No. 5, p. 1131, 5/83.

"Thick Tungsten Films in Multilayer Conductor Systems: Properties and Deposition Techniques", R. S. Blewer, V. A. Wells, Proceedings of First International IEEE VLSI Multilayer Interconnection Conference, Jun. 21-22, 1984, p. 153.

"Selective Low Pressure Chemical Vapor Deposition of Tungsten", E. K. Broadbent, C. L. Ramiller, Journal of the Electrochem. Soc., vol. 131, No. 6, p. 1427, Jun. 1984.

METAL INTERCONNECTION SYSTEM WITH A PLANAR SURFACE

CROSS REFERENCE TO RELATED APPLICATION

This application is a continuation of application Ser. No. 453,068, filed Dec. 11, 1989, now abandoned, which is a is a continuation of application Ser. No. 218,513, filed July 5, 1988, now abandoned, which is a continuation-in-part of application Ser. No. 712,580, filed Mar. 15, 1985, now abandoned.

BACKGROUND

The electrical interconnections between electronic devices are an important part of any functioning circuit. Improper interconnections can reduce the performance of a circuit or prevent the circuit from operating entirely. Traditionally, these interconnections have been made with various conductors including the metals copper and aluminum. In no area are good reliable interconnections more important than in integrated circuits.

The prior art process for interconnecting with a conductor the electronic devices on a silicon wafer is described as follows. Connecting these electronic devices is typically the final step in the construction of the integrated circuit and is also referred to as the metalization process. The process begins with the wafer containing completed electronic devices built into and onto the wafer. These electronic devices including bipolar and field effect transistors are not connected. The surface of the wafer appears smooth, but on the device scale the surface is uneven and contains sharp discontinuities generated as the electronic devices were constructed.

The first step of the prior art process for interconnecting the electronic devices is depositing a dielectric material on the uneven surface of the silicon wafer. Traditionally, the dielectric has been silicon dioxide. The silicon dioxide forms a thin layer on the surface of the wafer. This dielectric layer preserves and can accentuate the discontinuities on the surface of the wafer.

The second step is selectively removing the dielectric material to create holes which expose the contacts of the electronic devices. These holes are formed by selectively etching through the dielectric layer at specific locations. There are several well understood prior art methods for etching through the dielectric layer. These methods typically involve placing a photoresist on the surface of the device, exposing the photoresist to a particular wavelength of light, developing the photoresist to form a mask which exposes the dielectric material where it is to be removed, and removing the exposed dielectric material with either a wet or a dry etchant. Finally, the photoresist mask is removed exposing the dielectric layer.

The third step is depositing a conductor on the surface of the wafer. This conductor is typically aluminum, although other conductors may be used. Two different prior art method may be used to deposit the conductor. The methods are sputtering, where atoms of the conductor are knocked from a target made of the conductor and splattered onto the surface of the wafer, and evaporation, where the conductor is carried to the wafer in a vapor state and condenses on the surface of the wafer. In addition to providing a uniform layer of conductor on the wafer, this method must also fill the holes created in the previous step. These conductor filled holes are known as vias and serve as contacts to the electronic devices located below the dielectric layer.

The fourth and final step is removing selectively the conductor where it is not needed to form lines. The lines connect the electronic devices to form the desired circuit. This step is performed using a method which is very similar to the selective removal of dielectric and typically involves forming a photoresist mask and removing the conductor with an etchant.

This prior art process of interconnecting the electronic devices is referred to as a "subtractive" process since to form the lines which interconnect the electronic devices, the conductor is first deposited everywhere, then selectively removed. This process may be repeated as necessary to generate additional interconnection layers, although more than two interconnection layers are rare because of the problems described below.

The prior art process has several problems. The first and most severe problem is shorted and open lines.

Open lines occur in the prior art process when the conductor does not cover the sharp discontinuities on the surface of the wafer leaving gaps or opens in the lines. The source of these discontinuities is primarily the basic electronic devices which are built into and onto the wafer and the vias formed in previous process steps. When more than one interconnection layer is used, the problem is further aggravated by the lines in lower levels which themselves create discontinuities in higher layers. The problem is compounded when these discontinuities are accentuated by the typical method used to deposit the dielectric layer on the surface of the wafer. A discontinuity can be modeled by a higher horizontal surface, a first corner, a vertical surface, a second corner, and a lower horizontal surface. The first corner is exposed from the top and side. If this corner is 90 degrees, it has an angle of exposure of 270 degrees. However, the lower corner, if it is 90 degrees, has an angle of exposure of only 90 degrees. A flat surface, for example the higher and lower horizontal and vertical surfaces, are exposed from 180 degrees. Since the typical method of depositing the dielectric has a constant arrival rate, the rate of growth is dependent on the angle of exposure of the surface or corner. Therefore, the first corner, which is exposed more than any other surface, grows the fastest. In fact the first corner grows so fast, faster than the higher horizontal surface, that it begins to rise up above that surface accentuating the discontinuity represented by the original corner.

When the conductor is deposited on the dielectric covered discontinuities, the first corner growth will shadow or mask the vertical surface and the second corner by reducing the angle of exposure. The reduced angle of exposure of the vertical surface and the second corner, reduces the growth rate on those surfaces causing a very thin layer of conductor to be applied or even possibly leaving an open in the conductor. Even assuming that the vertical wall has no opens after the conductor has been deposited as described above, opens may still develop in the thinly coated walls of the via or in any other thinly coated location. Although the thin spot may test as a complete circuit immediately after construction, the conductor may eventually open due to electromigration. The thinner the conductor is, the higher the flux density for a given current will be through the conductor. The increased flux density in the narrow region may cause electromigration of the conductor atoms resulting in the atoms at the thin spot moving to a thicker spot. This causes the thin spot to become even thinner, eventually resulting in an open. Electromigration is particularly a problem when aluminum is the conductor.

Open and shorted lines also occur in the prior art process when the layer of the conductor is improperly etched. Shorts may be caused by underetching. Underetching occurs when all of the conductor is not removed by the etchant leaving the conductor, for example, between two lines forming a short. Opens and thin spots may be created by overetching, removing too much conductor, or undercutting. Etching occurs where the conductor is exposed through a mask to the etchant, however, what is etched depends on whether the etchant is isotropic or anisotropic. An isotropic etchant etches the conductor at a constant rate in all directions. An anisotropic etchant etches in one direction more rapidly than any other. If the etchant is isotropic in nature, the etchant will begin to dissolve the exposed material, but in all directions. This causes the removal of the conductor directly under the mask and is referred to as undercutting. A certain amount of undercutting is normal. When the conductor is deposited on the surface of the wafer, the conductor will form large overhangs at discontinuities on the wafer for reasons similar to that for the dielectric. When large overhangs are present on the wafer, the conductor must be exposed to the etchant for a longer period of time to prevent shorts. This leads to excessive undercutting which may cause open lines, or thin spots.

If an anisotropic etchant is used, the etchant will begin to dissolve the exposed material but primarily in one direction toward the wafer. Therefore, undercutting is considerably reduced when an anisotropic etchant is used. However, the etchant may leave conductor in the bottom of a discontinuity, thereby causing shorts. This may be understood by referring to the model of a discontinuity above. The etchant must first remove the large overhang of conductor on the first corner and the vertical wall before removing the conductor in the second corner. Because the quantity of conductor which must be removed is considerably more than in any other place on the wafer the etching process may be stopped before the etchant has removed the conductor in the second corner. The conductor remaining in the second corner causes a short between two lines. As geometries approach the one micron level shorts and opens caused by the etching process become an increasing problem.

The second problem with the prior art process is electrically open vias. The vias begin as holes in the dielectric etched in the second step of the prior art process. When the conductor is deposited in the third step, it first covers the top of the dielectric layer and the bottom of the hole. Because the top of the hole has a higher angle of exposure, it begins to build more rapidly, as occurred above with the dielectric at a discontinuity. The excess material at the top of the hole will tend to shadow or mask the vertical walls of the hole, thereby causing the vertical surfaces of the hole to remain uncovered. Absence of the conductor on the side of the via leaves the top and the bottom of the via unconnected causing an open circuit. This problem also becomes more serious as integrated circuit geometries are reduced. One method of depositing the conductor tungsten called chemical vapor deposition has been used to reduce the problem. However, even when the surface surrounding the top and the bottom of the via are properly connected, a dimple is formed at the top of the via. This dimple causes further discontinuities for later interconnect layers.

Finally, a third problem occurs as geometries of the lines are reduced as required for VLSI integrated circuits. The ratio between the height of the line and the width of the line is referred to as the aspect ratio. When the geometries of the lines and vias are reduced, the aspect ratio increases because the lines of the conductor which form the interconnections between the electronic devices are reduced in width, but not in height. As the width of the line becomes narrower, there is less area between the line and the dielectric layer. Therefore there is less area to adhere to the dielectric. The height of the conductor line however is not reduced so the internal forces remain as strong as before. When the internal forces exceed the adhesion force, which occurs more frequently with a high aspect ratio, the line lifts off of the dielectric layer and ruins the integrated circuit.

The prior art means to reducing the problem is to reduce the height of the line. Reducing the height of the line reduces the cross sectional area of the line which increases the resistance of the line. In VLSI circuits where the lines are at the one micron and submicron levels, the line may actually require a very large electronic device to drive the line at a high speed. Since such large devices would operate too slowly, a smaller device and shorter line must be used. This condition is referred to as "wire limited" circuitry and severely restricts circuit design and organization and is therefore undesirable. Also since the prior art process is basically a subtractive process, any overetching during the fourth step of the metalization process will also reduce the width of the lines and cause the same problems with adhesion and "wire limiting" as caused by a reduction in the geometries.

SUMMARY

In accordance with the preferred embodiment of the present invention, a process is described for electrically interconnecting electronic devices located on a surface through two or more planar linking layers. The same three step process is used for construction of vias and lines for all layers. The process differs from the prior art in that it is an "additive" process which places the conductor only where it is needed, rather than the "subtractive" process of the prior art which applies conductor everywhere and then removes the conductor where it is not needed.

The present invention is superior to the prior art in several ways. First, the process is essentially planar, the process does not introduce discontinuities onto the wafer and in fact tends to reduce and eliminate any discontinuities present on the wafer. Second, this process avoids the discontinuities or dimples which occurred at vias in the prior art because the conductor could not be applied in a manner which fills the holes evenly. Finally, this process offers higher adhesion between the line and the surface than was available in the prior art, especially for lines with high aspect ratios.

The use of a planar interconnection scheme avoids many of the prior art problems. A planar interconnection scheme offers a flat and relatively smooth surface on which to build the interconnect lines. This eliminates the shorts and opens caused when the conductor is forced to bend around devices and other lines located on the wafer. Furthermore, since the process is essentially planar, the problems caused in the photoresist masking process by uneven surfaces are avoided. The planar process also offers reduced capacitance because there is more distance between lines and devices in the layered approach than in the prior art process.

The preferred embodiment of the present invention is superior to the prior art process because this process avoids the discontinuities or dimples which are found at vias in the prior art because the conductor fills the hole evenly. Because the conductor is deposited at the bottom of the hole and built up through the hole, this process avoids the opens of the prior art which occurred in the via when the top of the via failed to come into contact with the bottom of the via. Any undercutting which might have occurred during the etching process used to remove the dielectric is an advantage for integrated circuits constructed in accordance with the present invention. If the dielectric is undercut, more conductor is used to fill the via or line. This results in a larger line with a lower resistance which means a longer line may be used before the circuitry becomes "wire limited."

Finally, when the conductor is deposited in the trench to form a line, there is more contact area between with the conductor and the dielectric and therefore better adhesion than when the line is deposited on top of the wafer. All of these reasons make the preferred embodiment of the present invention a substantial improvement over the prior art.

DESCRIPTION OF THE PREFERRED EMBODIMENT

Figure 1:
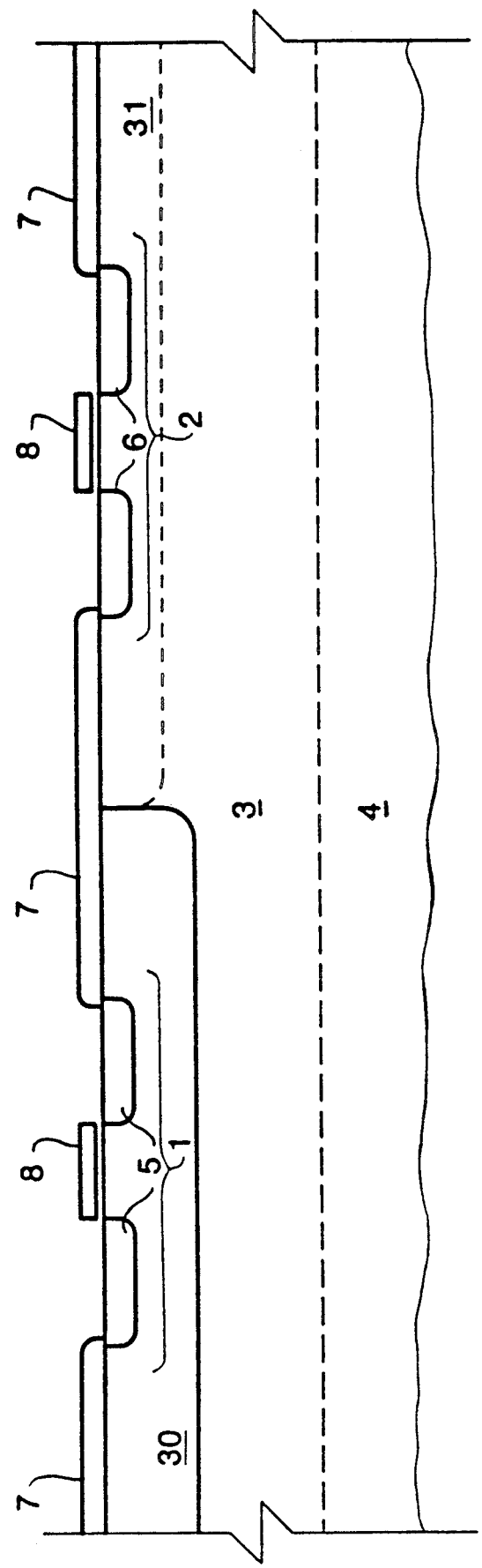
FIG. 1 is a side view of a typical silicon wafer with electronic devices on its surface.

A process in accordance with the present invention begins with a silicon wafer which has the electronic devices built into and onto the surface of the wafer and which is ready to nave the interconnections between electronic devices added to the wafer. FIG. 1 is a side view of a typical silicon wafer 4 with epitaxy layer 3 grown onto the silicon wafer 4. A p-tub 31 and an n-tub 32 are diffused into the epitaxy layer 3. Electronic devices 1 and 2 are built into the n-tub and p-tub respectively. The wafer is now ready to have the interconnections between devices added to make a functional circuit.

Figure 2:
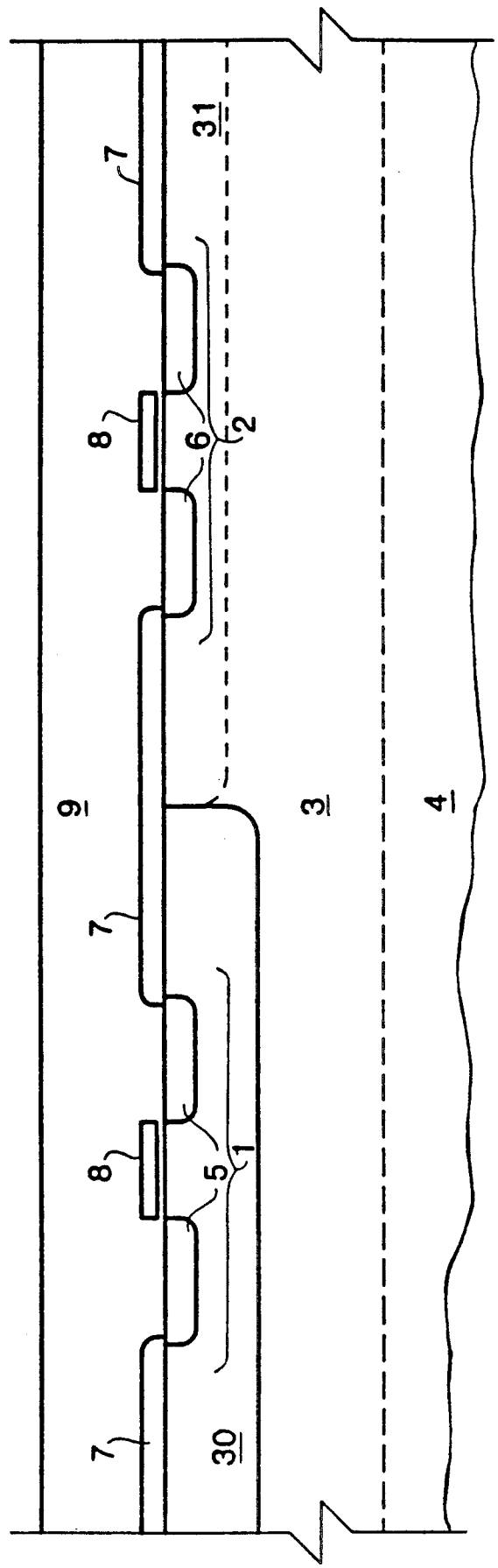
FIG. 2 is a side view of the wafer of FIG. 1 illustrating the first dielectric layer which results from the first step of a process in accordance with the present invention.

The first step of the process is to deposit a first dielectric layer on the surface of the wafer. The dielectric layer may contain one or more dielectric materials. Various prior art techniques and materials may be used. In the preferred embodiment of the present invention, the dielectric layer comprises a layer of polyimide deposited on the surface of the wafer followed by a layer of silicon dioxide (oxide). Polyimide is a spin-on polymer dielectric having addition surface tension characteristics which tend to planarize the surface of the wafer making it smooth even at the device level. The oxide layer is placed on top of the polyimide layer for reasons explained below. FIG. 2 is a side view of the wafer of FIG. 1 illustrating the first dielectric layer 9 which results from the first step of the process. This first dielectric layer serves as an insulator between the electronic devices 1 and 2 and the lines in any subsequent linking layers.

Figure 3:
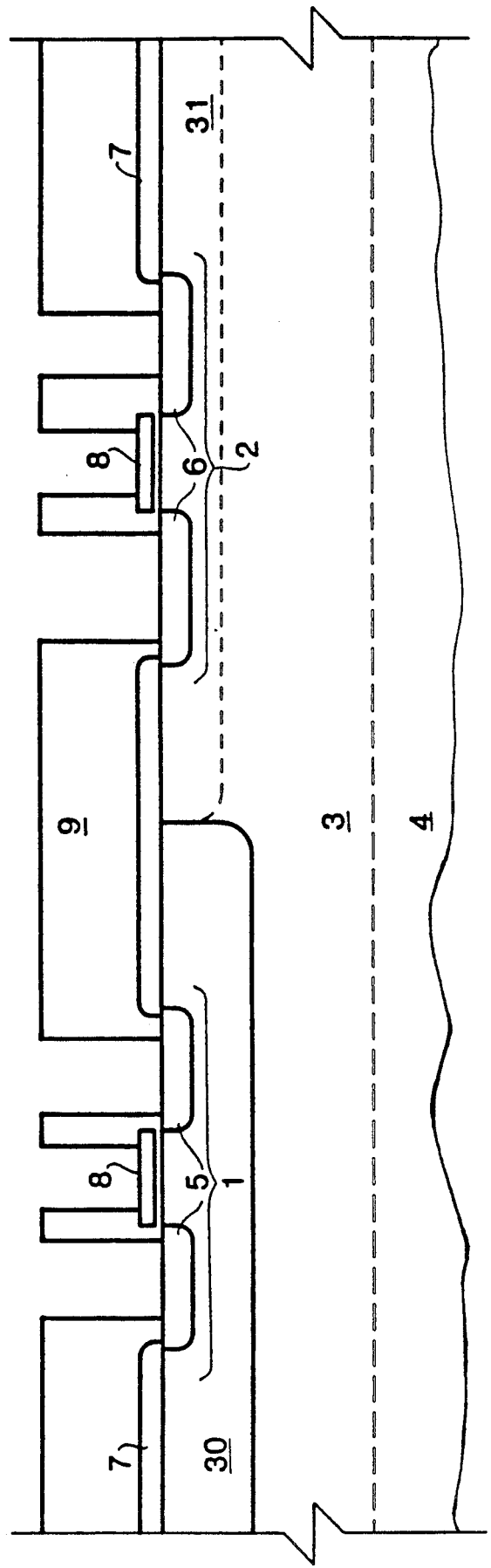
FIG. 3 is a side view of the wafer illustrating holes in the dielectric layer which result from the second step of the process.

The second step of the process is to selectively remove portions of the dielectric layer to expose the contacts of the electronic devices. Various prior art techniques may be used to remove the dielectric and create holes through which the electronic devices may be connected. In the preferred embodiment of the present invention, a photoresist is applied to the wafer. The photoresist is exposed with a particular wavelength of light where the contacts of the electronic device are located. The photoresist is then developed to form a mask which exposes the dielectric at these locations. The dielectric is then removed with a dry etchant. A wet etchant could also be used to remove the dielectric. Both wet and dry etchants are well known in the prior art. The mask is then removed. FIG. 3 is a side view of the wafer illustrating the holes in the first dielectric layer 9 which result from the second step of the process.

The third step of the process is to selectively deposit a conductor in the holes created in the first dielectric layer 9. The conductor is not deposited on top of the dielectric, which was a characteristic of the prior art. In the preferred embodiment of the present invention, a method for selectively depositing the conductor tungsten on the wafer is used. This method employs a technique known as chemical vapor deposition of tungsten or CVD Tungsten. CVD Tungsten deposition operates as follows. The surface of the wafer onto which the conductor is to be deposited is exposed to a gas consisting of $WF_6$ and diatomic hydrogen. No reaction occurs until the gas is exposed to a catalyst. A catalyst, for example, a metal or a silicide on the surface of the wafer causes the diatomic hydrogen to disassociate into two monatomic hydrogen atoms. The monatomic hydrogen atom then reacts with $WF_n$ as follows:

$$WF_n + H \rightarrow HF + WF_{n-1}$$

The above reaction is repeated until a tungsten atom is deposited on the surface of the catalyst. Since tungsten, a metal, acts as a catalyst itself the reaction continues until the wafer is removed from the gas. Silicon will also act as a catalyst. The use of this technique is known in the prior art and is further described in the following articles: *Thick Tungsten Films in Multilayer Conduction Systems: Properties and Deposition Techniques*, R. S. Blewer and V. A. Wells. Proceedings of the First IEEE VLSI Multilayer Interconnection Conference, June 21-22, 1984, Page 153; and *Selective Low Pressure Chemical Vapor Deposition of Tungsten*, E. K. Broadbent, C. L. Ramiller, Journal of Electrochemical Society, Vol. 131, No. 6, Page 1427, June 1984.

In order for the tungsten to be selectively deposited, an area may need to be activated or deactivated. Activation is required when the material which makes up the bottom and sides of the hole or trench will not start the growth of the conductor. Deactivation is required when the material on the surface of the wafer will start the growth of the conductor where it is not desired. For tungsten, any metal, silicon, or silicide will act as an activator to start the growth of tungsten and any oxide or silicon nitride will act as a deactivator to prevent the growth of tungsten. Polyimide in an undamaged state will act as a deactivator. However, if the atomic structure of the polyimide has been damaged, for example, by exposure to a etchant in a previous process step, polyimide will act as an activator to start the growth of tungsten.

Activation and deactivation may occur without a separate step. For example, tungsten will be deposited selectively in holes and trenches but not on the surface of the dielectric where the bottom of a hole or trench exposes metal and the dielectric is an oxide or where the bottom of a hole or trench exposes etched polyimide or metal and the surface of the dielectric is undamaged polyimide. In these cases, conductor will be selectively deposited without further action. In the preferred embodiment of the present invention, polyimide is used as the dielectric. Where the dielectric is polyimide, the damaged polyimide which lines the sides of the etched hole acts as a catalyst to cause tungsten to be deposited. However, the surface of the polyimide constructed in accordance with the preferred embodiment may be damaged and therefore require deactivation. In the preferred embodiment, this is accomplished by applying a layer of oxide on top of the polyimide as described above in the first step of the process which deposits the dielectric layer. Where a silicon dioxide or other oxide is used as a dielectric, the bottom of trenches which are not metal will require activation.

Several approaches to activation may be used. A thin layer of polyimide may be applied to the surface of the wafer before the oxide is applied. Another approach would be to use a lift-off technique. For example, a lift-off technique to activate an area would comprise, applying a photoresist mask, selectively removing the dielectric, depositing a thin layer of conductor unselectively over the entire surface of the wafer and then the photoresist mask would be removed along with the thin layer of conductor on the surface of the dielectric. The layer of conductor at the bottom of the holes and trenches would remain to act as the catalyst. Then the wafer would be exposed to the gas and tungsten deposited. For devices constructed in accordance with the preferred embodiment of the present invention, the conductor is not deposited at the top of the hole, therefore the masking effect is not present and the holes fill evenly.

Figure 4:
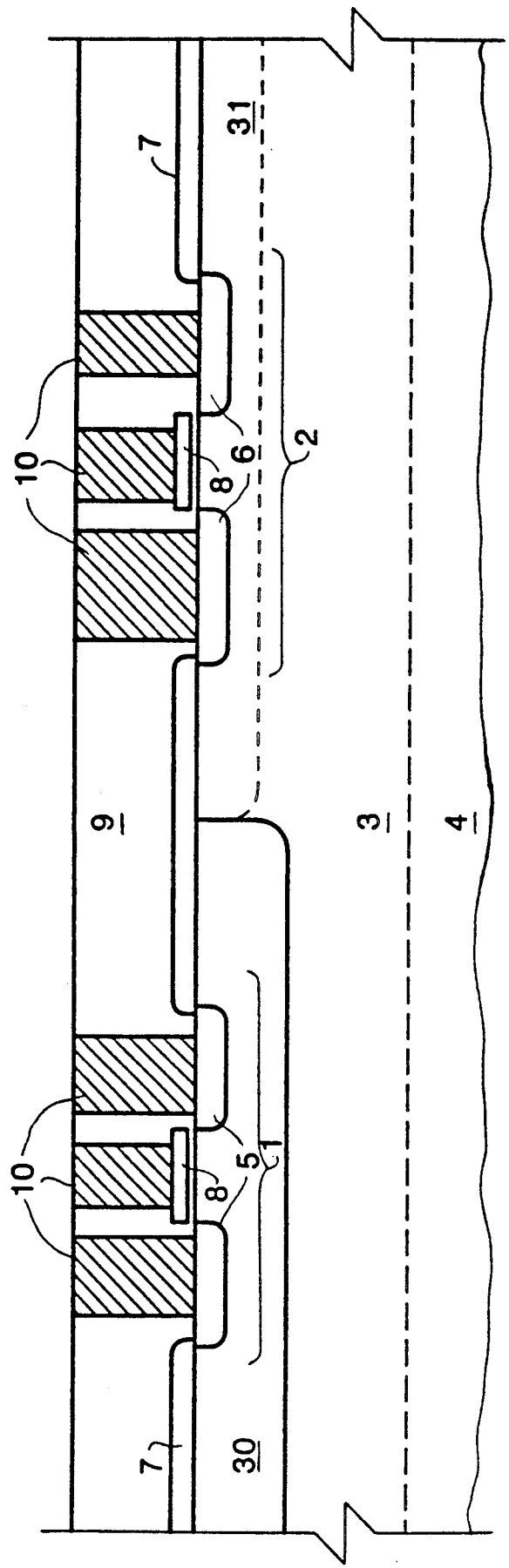
FIG. 4 is a side view of the wafer illustrating the vias of the dielectric layer which result from the third step in the process.

FIG. 4 is a side view of the wafer illustrating the conductor filled holes, or vias, 10 in the first dielectric layer 9 which result from the third step of the process. The metal at the bottom of the hole and the damaged polyimide on the sides of the hole act as a catalyst to start the growth of the conductor. Once the tungsten has covered the base of the hole, tungsten begins to grow up through the hole, and eventually becomes approximately level with the top of the hole. This completes the first linking layer. The first linking layer primarily acts to isolate the electronic devices 1 and 2 from later linking layers and to provide contacts to the electronic devices for later linking layers.

Figure 5:
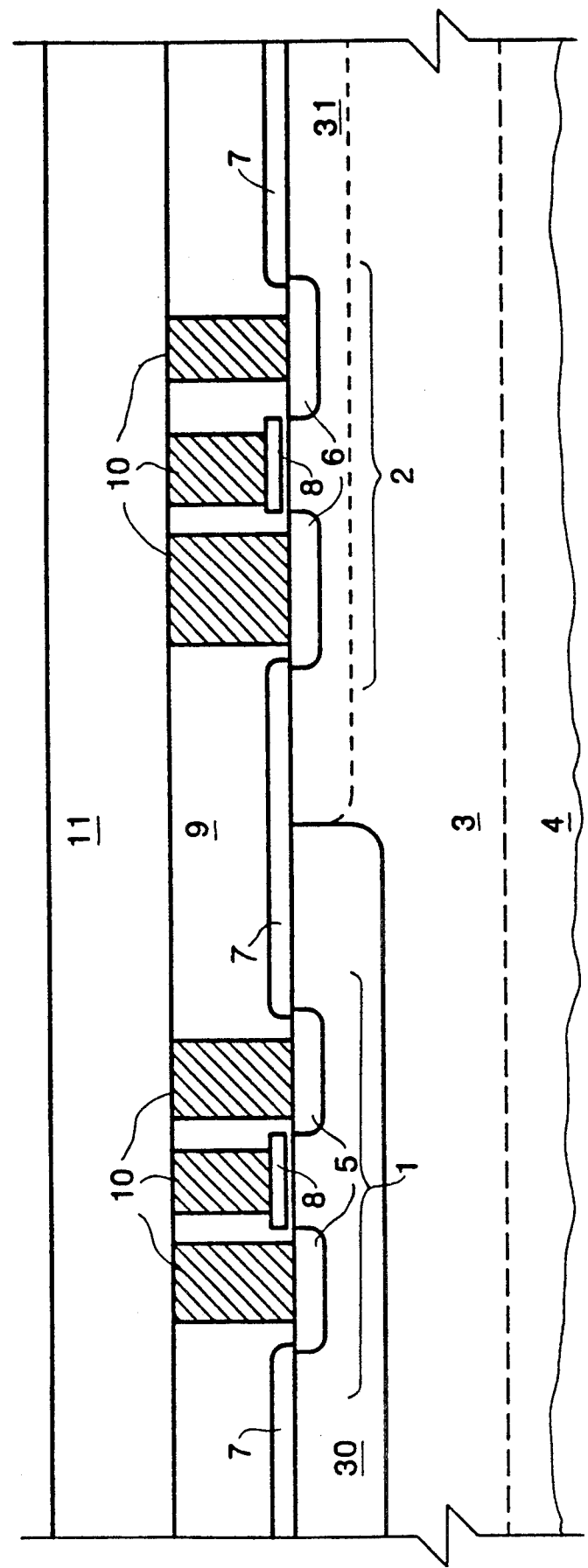
FIG. 5 is a side view of the wafer illustrating a second dielectric layer which results from repeating the first step of the process.
Figure 6:
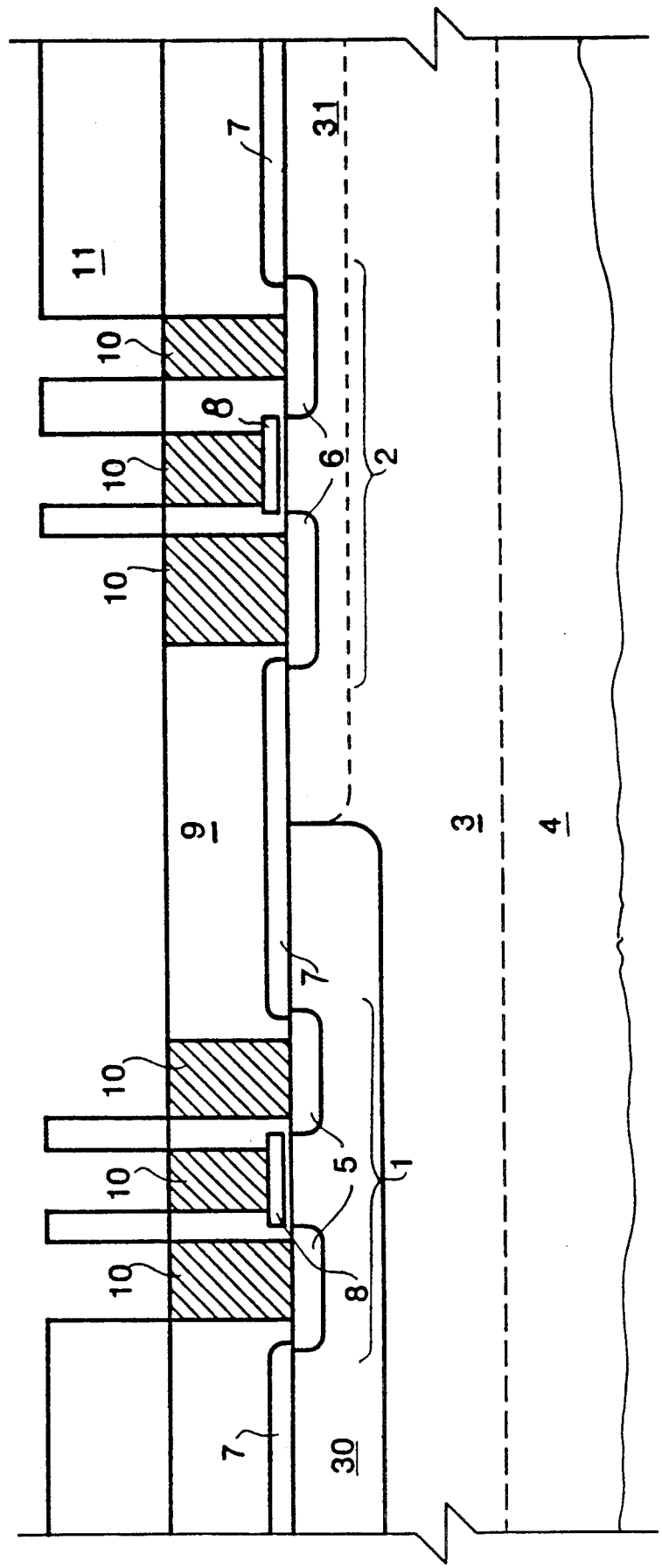
FIG. 6 is a side view of the wafer illustrating holes and trenches in the second dielectric layer which result from repeating the second step of the process.
Figure 7:
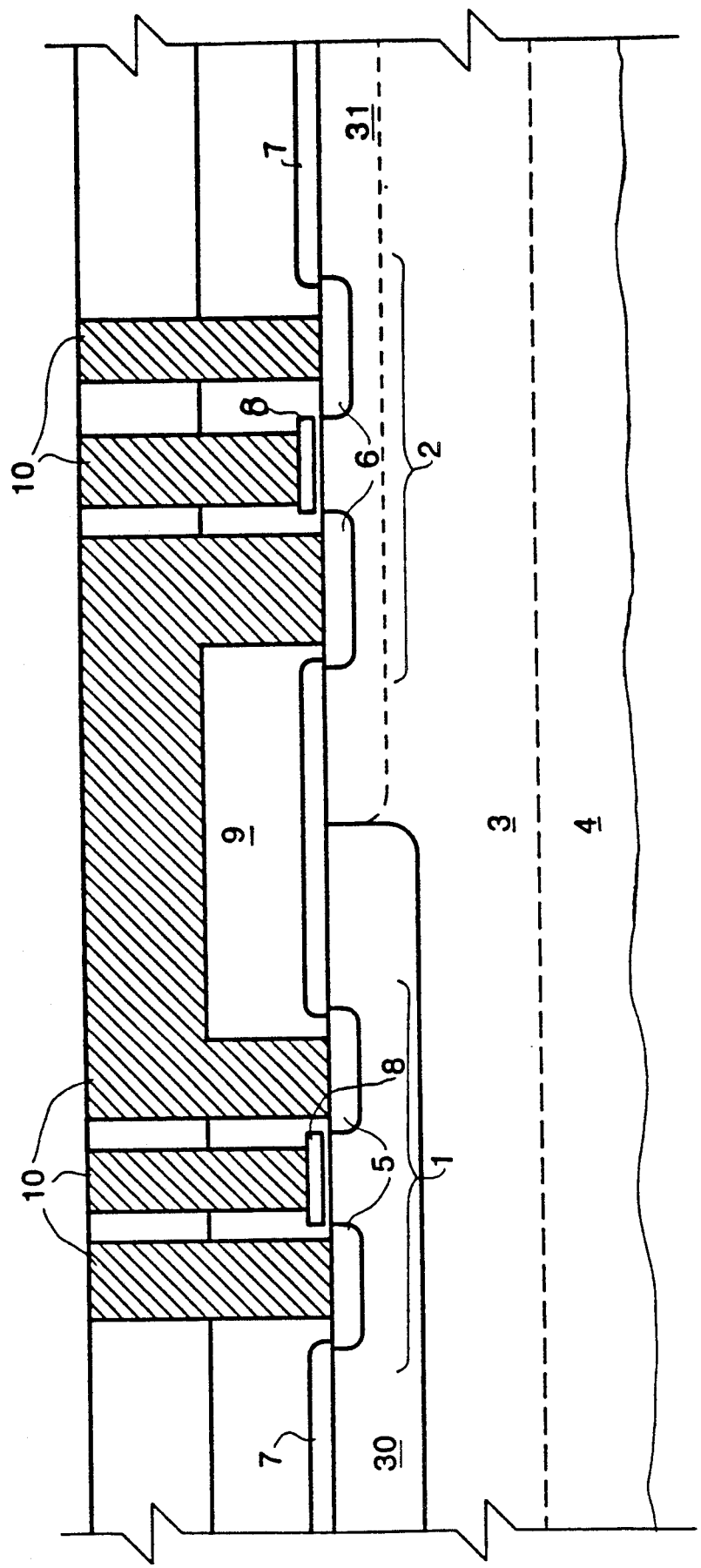
FIG. 7 is a side view of the wafer illustrating the vias and lines in the second dielectric layer which result from repeating the third step of the process.

The fourth step of the process is to repeat the first three steps of the process. The second linking layer primarily acts to interconnect the electronic devices by connecting the vias in the first planar layer with lines in the second planar layer. The second linking layer may also contain vias for later linking layers. The fourth step is illustrated by FIGS. 5, 6, and 7. First, a second dielectric layer is deposited on top of the first dielectric layer using the method described above in the first step. FIG. 5 is a side view of the wafer illustrating a second dielectric layer 11 which results from repeating the first step of the process. If a deactivation or activation layer has been used in the previous steps, it may be removed before applying the second dielectric layer, or it may be left and removed where it is not required during the selective removal of the second dielectric layer. In the preferred embodiment, the layer is not removed before another dielectric layer is deposited, rather the oxide deactivation layer is removed only when necessary as part of the following step. Second, the second dielectric layer is selectively removed to create holes for vias and trenches for lines. The holes and trenches may be created by any method such as the one described above in the second step. FIG. 6 is a side view of the wafer illustrating the holes and trenches in the second dielectric layer 11 which result from repeating the second step of the process. Finally, the holes and trenches created in the second step are filled with a conductor using any process such as the one described above in the third step, to form vias and lines respectively. FIG. 7 is a side view of the wafer illustrating the vias and lines in the second dielectric layer which result from repeating the third step of the process. The vias and lines 10 reach through the entire second dielectric layer 11 to make a good electrical connection with the vias in the first dielectric 9.

Figure 8:
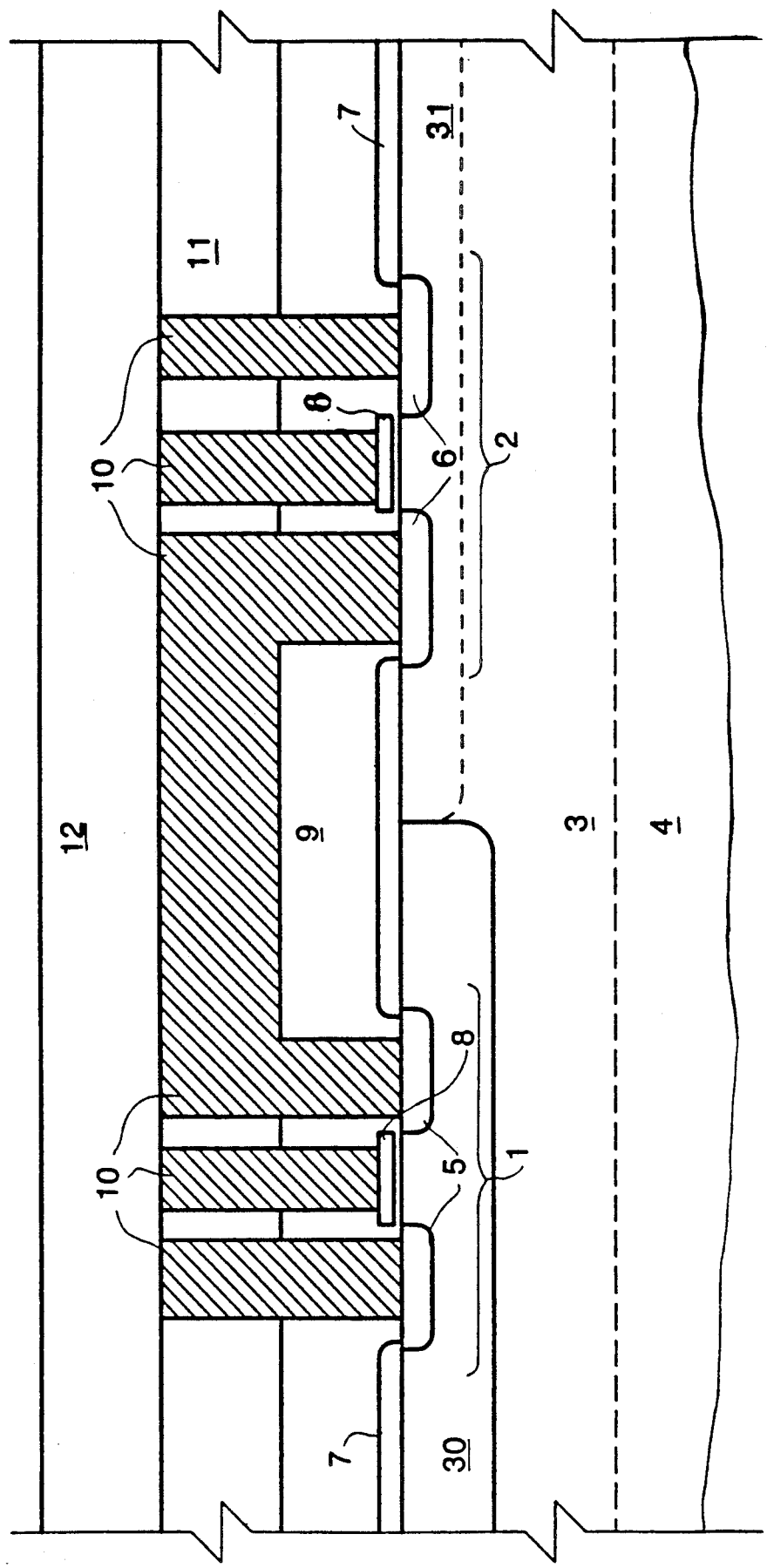
FIG. 8 is a side view of the wafer illustrating a third dielectric layer which results from repeating the first step of the process.
Figure 9:
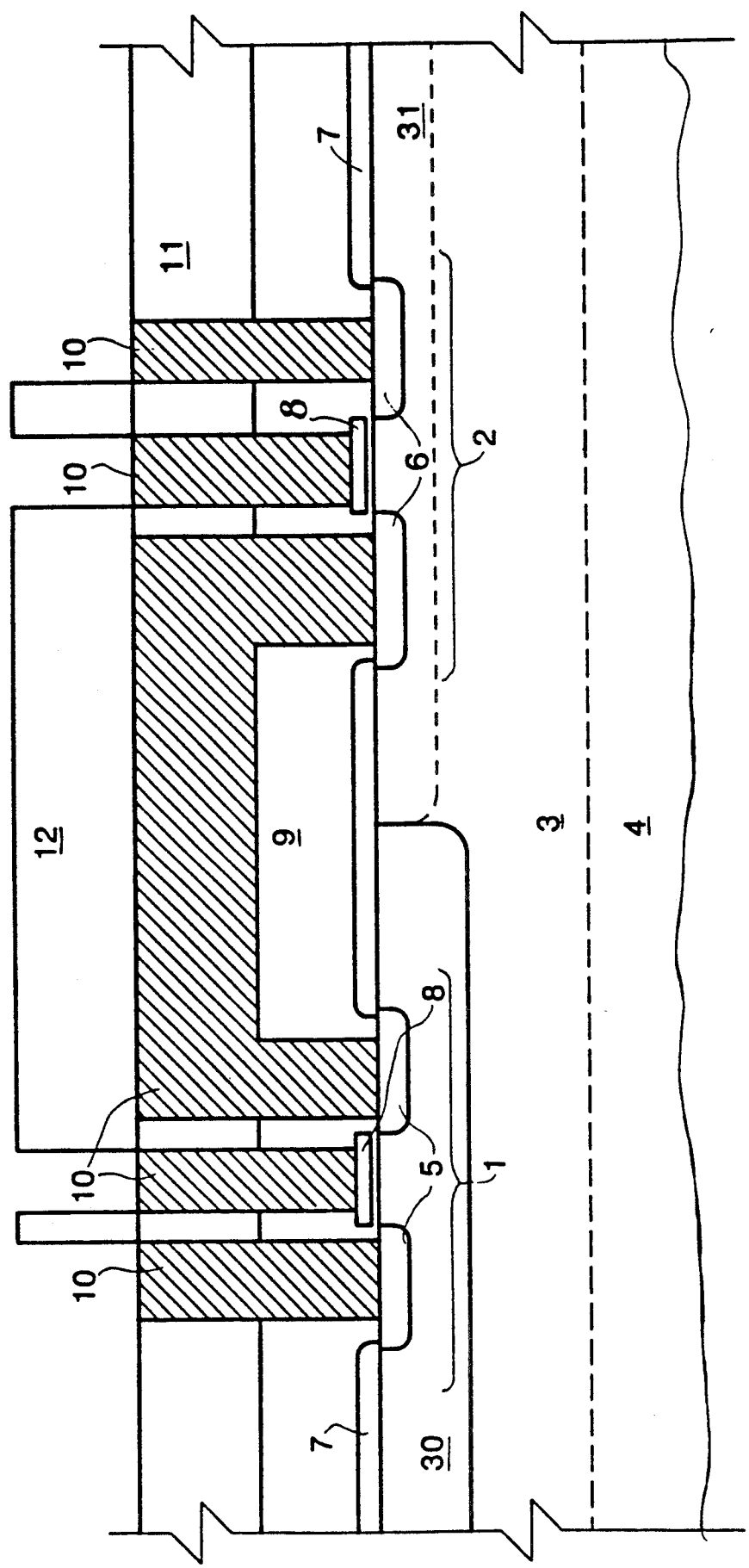
FIG. 9 is a side view of the wafer illustrating holes and trenches in the third dielectric layer which result from repeating the second step of the process.
Figure 10:
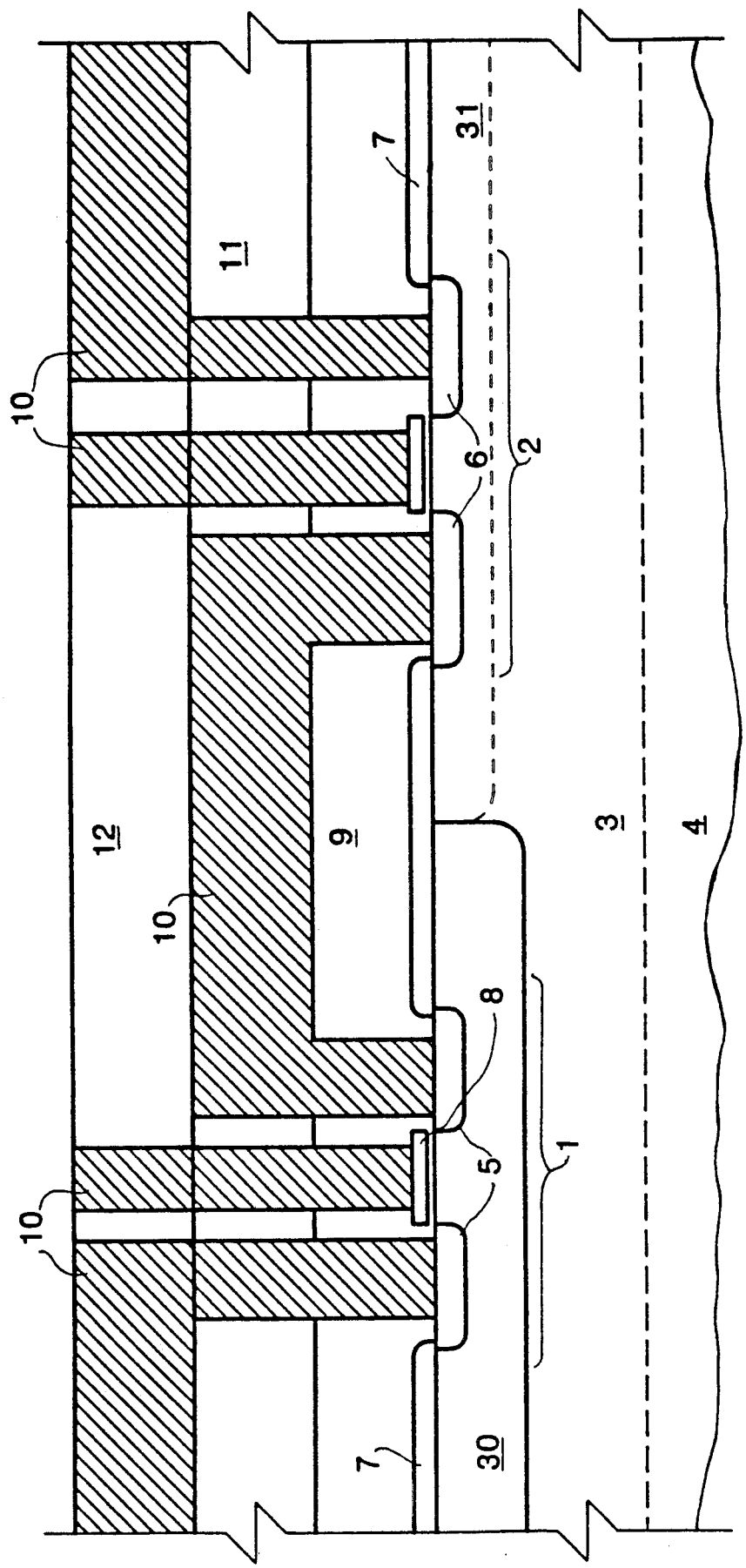
FIG. 10 is a side view of the wafer illustrating the vias and lines in the third dielectric layer which result from repeating the third step of the process.

A third linking layer may then be added to interconnect the vias created above in the fourth step. This third planar linking layer, like the second planar linking layer, may be produced by repeating the fourth step of the process. In fact, the fourth step may be repeated as many times as necessary to completely interconnect the electronic devices located on the wafer. Since each layer is planar there are none of the problems of the prior art discussed above. FIGS. 8, 9, and 10 illustrate a third linking layer. The same three steps are repeated. First, a third dielectric layer is deposited on top of the second dielectric layer using any method such as the method described above in the first step. FIG. 8 is a side view of the wafer illustrating a third dielectric layer 12 which results from repeating the first step of the process. Second, the third layer of the dielectric is selectively removed to create holes and trenches in the third layer. The holes and trenches are selectively created in the dielectric where the vias and interconnections are to be made. The holes and trenches may be created by any method such as the one described above in the second step. FIG. 7 is a side view of the wafer illustrating the holes and trenches in the third dielectric layer 12 which result from repeating the second step of the process. Finally, the holes and trenches created in the second step are filled with a conductor using any process such as the one described above in the third step. FIG. 7 is a side view of the wafer illustrating the vias and lines 10 in the third dielectric layer 12 which result from repeating the third step of the process. Each via and line 10 reaches through the entire third linking layer to make a good electrical connection with the vias and lines in the second linking layer.

The present invention may be used to make interconnections on any relatively smooth surface. For example, the present invention could be used to provide the interconnections for a hybrid circuit. Electronic devices would be added at the end of the process on top of the linking layers. Beginning with an insulator such as a ceramic substrate or anodized aluminum, first, a dielectric layer, for example, silicon dioxide or a ceramic material, would be applied to the surface. The material could either be selectively applied through, for example, a silk screen or applied as a layer and then selectively removed to expose the substrate. Then a conductor would be deposited where the substrate is exposed. Multiple layers could be used, with the final layer providing pads to connect to the contacts of the electronic devices.

I claim:

1. A process for forming a multilayer integrated circuit having substantially planarized layers of dielectric and tungsten conductors comprising the steps of:

depositing a first dielectric layer on a substantially non-planarized surface of said integrated circuit to form a first substantially planarized surface;

forming a first mask on said first dielectric surface in a first predetermined pattern to expose portions of said first substantially planarized surface to be etched and to protect remaining portions of said first substantially planarized surface from activation during etching;

selectively removing portions of said first dielectric layer corresponding to said first predetermined pattern formed by said first mask using an etchant such that said etchant activates etched surfaces of said first dielectric layer by damaging said etched surfaces of said first dielectric layer;

leaving damage caused by said etchant on said etched surfaces of said first dielectric layer to induce tungsten to grow on said etched surfaces;

removing said first mask from said first dielectric surface;

growing tungsten on said etched surfaces which is induced by said damage caused by said etchant to said etched surfaces of said first dielectric layer using chemical vapor deposition techniques until said tungsten substantially fills selectively removed portions of said first dielectric layer to form a substantially planarized surface corresponding to said first substantially planarized surface of said first dielectric layer and tungsten;

depositing a second dielectric layer on said substantially planarized surface of said first dielectric layer and said tungsten to form a second substantially planarized surface;

forming a second mask on said second substantially planarized surface in a second predetermined pattern to expose portions of said second substantially planarized surface to be etched and to protect remaining portions of said second substantially planarized surface from activation during etching;

selectively removing portions of said second dielectric layer corresponding to said second predetermined pattern formed by said second mask using an etchant such that said etchant activates etched surfaces of said first and second dielectric layer by damaging said etched surfaces of said first and second dielectric layer;

leaving damage caused by said etchant on said etched surfaces of said first and second dielectric layer to induce tungsten to grow on said etched surfaces of said first and second dielectric layer; and, removing said second mask from said second substantially planarized surface;

growing tungsten on etched surfaces of said first and second dielectric layer which is induced by said damage caused by said etchant to said etched surfaces of said first and second dielectric layer using chemical vapor deposition techniques until said tungsten substantially fills selectively removed portions of said second dielectric layer to form a substantially planarized surface corresponding to said second substantially planarized surface of said second dielectric layer and tungsten.

2. The process of claim 1 further comprising the steps of:

depositing additional dielectric layers;

forming additional masks on said additional dielectric layers;

selectively removing portions of said additional dielectric layers with an etchant to activate etched surfaces of said additional dielectric layers;

growing tungsten on said etched surfaces of said additional dielectric layers to form additional planarized surfaces.

3. In a multilayer integrated circuit having at least one substantially planarized layer of dielectric, a process for depositing tungsten on dielectric surfaces to form conductive interconnections and maintaining substantial planarization comprising the steps of:

a. forming a mask on a first substantially planarized dielectric layer;

b. using an etchant to remove portions of said first substantially planarized dielectric layer exposed by said mask to form openings in said first substantially planarized dielectric layer and to expose portions of an underlying dielectric layer such that said etchant activates etched portions of said underlying dielectric layer and said openings in said first dielectric layer by damaging surface areas of said etched portions of said underlying dielectric layer and said openings in said first dielectric layer;

c. leaving said surface areas of said etched portions of said dielectric layer and said openings in said first dielectric layer that are damaged by said etchant present on said etched portions of said dielectric layer and said openings of said first dielectric layer;

d. growing tungsten on etched portions of said underlying dielectric layer and said first dielectric layer until said tungsten fills said openings in said first substantially planarized dielectric layer to form a substantially planarized surface.

* * * * *